(12) United States Patent
Okamura

(10) Patent No.: US 7,339,421 B2
(45) Date of Patent: Mar. 4, 2008

(54) DIFFERENTIAL CIRCUIT AND RECEIVER WITH SAME

(75) Inventor: Jun-ichi Okamura, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 118 days.

(21) Appl. No.: 10/533,141

(22) PCT Filed: Oct. 30, 2003

(86) PCT No.: PCT/JP03/13942

§ 371 (c)(1),
(2), (4) Date: Dec. 15, 2005

(87) PCT Pub. No.: WO2004/040754

PCT Pub. Date: May 13, 2004

(65) Prior Publication Data

US 2006/0139085 A1    Jun. 29, 2006

(30) Foreign Application Priority Data

Oct. 31, 2002    (JP) ............................. 2002-318807

(51) Int. Cl.
    *G06G 7/12* (2006.01)
(52) U.S. Cl. ..................................... 327/563; 330/252
(58) Field of Classification Search ........ 327/560–563, 327/52, 65, 108; 330/252–253
    See application file for complete search history.

(56) References Cited

U.S. PATENT DOCUMENTS 5,045,806 A    9/1991    Yan
5,999,028 A    12/1999   Knoch et al.
6,297,685 B1 *  10/2001   Ewen et al. ................ 327/513
6,320,422 B1    11/2001   Koh
6,963,230 B2 *  11/2005   Morishita ..................... 327/77

FOREIGN PATENT DOCUMENTS

| JP | 62-230206 | 8/1987 |
| JP | 7-58872 B2 | 6/1995 |
| JP | 7-193439 A | 7/1995 |

OTHER PUBLICATIONS

James H. Atherton and H. Thomas Simmonds, "An Offset Reduction Technique for Use with CMOS Integrated Comparators and Amplifiers", 8107 IEEE, Aug. 27, 1992; New York, US.

* cited by examiner

*Primary Examiner*—Tuan T. Lam
*Assistant Examiner*—Diana J Cheng
(74) *Attorney, Agent, or Firm*—Michaud-Duffy Group LLP

(57) ABSTRACT

A differential circuit including a differential amplifier circuit having a differential element provided in a signal input circuit, a constant current source connected to the differential element, and loads respectively connected to the differential element, and a source follower circuit that outputs a differential voltage based on voltage drops developing across the loads, includes a current supply circuit that supplies a given current to the loads connected in series with the differential element when the differential element is off.

4 Claims, 12 Drawing Sheets

DIFFERENTIAL CIRCUIT AND RECEIVER WITH SAME

BACKGROUND OF THE INVENTION

1. Field of the Invention

This invention generally relates to differential circuits and receiving devices having the same used for small-amplitude and current-mode high-speed serial digital transmission signals, and more particularly, to a differential circuit having an input circuit and a buffer circuit included in a receiving device used for receiving high-speed serial digital transmission signals. The input circuit needs to handle a rail-to-rail input common-mode range having a terminal common-mode voltage near the ground level voltage to the power supply voltage and a differential output buffer circuits having a constant common-mode potential, that is independent of the input common-mode voltage are necessary for processing the high-speed signals inside the chip.

2. Description of the Related Art

Conventionally, the interface standards for the digital signals such as the transistor-transistor logic: TTL (2.0/0.8) and the complementary metal-oxide semiconductor: CMOS (3.3/0.0) have been used in the serial digital transmission. However, these standards are standardized for the digital signals that have relatively large voltage amplitudes, and there is a problem in that signal transmission delay is relatively large. Therefore, it is difficult to realize the high-speed serial digital transmission, which is demanded in these years, between the devices with the use of the above-mentioned standards.

In order to solve the aforementioned problem, small-voltage swing and current-mode differential transmission standards have been proposed in recent years. An example of the standards is LVDS (low Voltage Differential Signaling).

The LVDS standard only specifies the use of a differential current driver and terminal impedance. Therefore, the input differential circuit that meets the LVDS standard has to operate at an arbitrary common-mode terminal voltage. According to the standard, a current driver is used for a transmitting circuit (hereinafter, referred to as LVDS transmitter) drives a signal that meets the LVDS standard (hereinafter, referred to as LVDS signal) so that 350 mV of amplitude may be available as a terminal voltage, when the terminal impedance of 100 Ω is connected. On the other hand, the receiving circuit of the LVDS signal (hereinafter, referred to as LVDS receiver) is configured so that a terminal voltage difference of approximately 350 mV can be received, corresponding to the common-mode terminal voltage of 0 to 2.4 V. That is to say, if the power supply voltage Vcc of 2.5 V is set, the amplifier circuit in the input circuit of the LVDS receiver is to operate the common-mode input signal, which is substantially equal to the power supply voltage. The rail-to-rail operation denotes the operation of the common-mode input signals substantially equal to the power supply voltage.

Conventionally, as a structure of a rail-to-rail differential amplifier circuit with the use of CMOS technology, a topology has been proposed so that the limits of the both common-mode operation ranges may be compensated by connecting the differential amplifier circuit of an N-channel element in parallel with the differential amplifier circuit of a P-channel element.

Under the circumstances, the output from the amplifier circuit arranged as the input circuit is demanded to have desirable signal quality for the amplifier circuit provided in the later stage. That is, it is preferable that the differential output from the amplifier circuit of the input circuit has a constant common-mode potential to be independent of the input common-mode voltage in order to operate the high-speed signals inside the chip. Moreover, an appropriate buffer circuit has to be included to drive the load inside the chip.

For example, U.S. Pat. No. 6,320,422 discloses the technique of feed backing the output voltage in the buffer circuit to control and stabilize the differential output in the differential amplifier circuit. Hereinafter, the aforementioned patent will be referred to as a conventional technique 1, and will be described with reference to FIG. 1.

Referring to FIG. 1, the conventional technique 1 is configured to include a differential amplifier circuit having an N-channel differential amplifier circuit 801 and a P-channel differential amplifier circuit 813, a complementary source follower circuit 826 and a complementary source follower 828. Outputs (806 and 818) from the differential amplifier circuit are input into the complementary source follower circuit 826, and in the same manner, outputs (808 and 820) from the differential amplifier circuit are input into the complementary source follower 828. The above-mentioned two complementary source follower circuits 826 and 828 serve as the buffer circuits that drive the internal loads.

The N-channel differential amplifier circuit 801 includes an N-channel differential element 802, active loads 812 and 810, and a constant current source 804. The N-channel differential element 802 has a pair of N-channel MOS transistors (field-effect transistors are preferable. Hereinafter, simply referred to as transistors). The active loads 812 and 810 are the loads of the N-channel differential element 802. The constant current source 804 is connected to the N-channel differential element 802. In the same manner, the P-channel differential amplifier circuit 813 includes a P-channel differential element 814, active loads 822 and 824, and a constant current source 816. The P-channel differential element 814 has a pair of P-channel MOS transistors. The active loads 822 and 824 are the loads of the P-channel differential element 814. The constant current source 816 is connected to the P-channel differential element 814.

In the above-mentioned configuration, an output node 830 of the complementary source follower circuit 826 is connected to the active loads 810 and 822 respectively, which are composed of the N-channel MOS transistors. That is, the both edges of the voltages of the active loads 810 and 822 are controlled to feed back according to the output voltage of the complementary source follower circuit 826. In the same manner, an output node 832 of the complementary source follower circuit 828 is connected to the active loads 812 and 824 respectively, which are composed of the N-channel MOS transistors. That is, the both terminal voltages of the active loads 812 and 824 are controlled to feed back according to the output voltage of the complementary source follower circuit 828. This can prevent the operation points of the active loads 810, 812, 822, and 824 from shifting from the linear region into the saturation region. The operation is thus configured to always operate in the linear region, which prevents a non-linear operation of the differential output so as to stabilize the differential outputs.

However, with the configuration as disclosed in the conventional technique 1, it is impossible to stabilize the common-mode potentials of the output voltages from the two complementary source follower circuits provided in the output circuit, if the input common-mode voltage makes the two complementary source follower circuits operate in different modes. In addition, if the output voltage is configured to feed back as disclosed in the conventional technique 1, there may arise an oscillation by switching the output voltage at a high speed.

SUMMARY OF THE INVENTION

The present invention has been made under the above-mentioned circumstances and has an object of providing the differential circuit and the receiving circuit having the same. The differential circuit is capable of outputting a differential output having a constant common-mode potential without a feed back structure, and includes a buffer circuit suitable for driving the load inside the chip.

In order to achieve the above-mentioned objectives, according to one aspect of the present invention, preferably, there is provided a differential circuit including a differential amplifier circuit having a differential element provided in a signal input circuit, a constant current source connected to the differential element, and loads respectively connected to the differential element; and a source follower circuit that outputs a differential voltage based on voltage drops developing across the loads, characterized by further comprising a current supply circuit that supplies a given current to the loads connected in series with the differential element when the differential element is off. It is thus possible to output the differential output having a common-mode potential without a feed back structure and realize the source follower circuit serving as a buffer circuit suitable for driving the internal load inside the chip.

According to another aspect of the present invention, preferably, there is provided a differential circuit including a first differential amplifier circuit having a first differential element provided in a signal input circuit, a first constant current source connected to the first differential element, and a first and a second loads respectively connected to the first differential element; a second differential amplifier circuit having a second differential element provided in the signal input circuit, a second constant current source connected to the second differential element, and a third and a fourth loads respectively connected to the second differential element; a first source follower circuit that outputs a first differential voltage based on voltage drops developing across the first and second loads; and a second source follower circuit that outputs a second differential voltage based on the voltage drops developing across the third and fourth loads, characterized by further comprising a first current supply circuit that supplies a given current to the first and second loads when the first differential element is off; and a second current supply circuit that supplies the given current to the third and fourth loads when the second differential element is off. It is thus possible to output the differential out put having a common-mode potential without a feed back structure and realize the first and second source follower circuits serving as buffer circuits suitable for driving the internal load inside the chip.

According to another aspect of the present invention, preferably, there is provided a receiving device having a differential circuit including a differential amplifier circuit having a differential element provided in a signal input circuit, a constant current source connected to the differential element, and loads respectively connected to the differential element; and a source follower circuit that outputs a differential voltage based on voltage drops developing across the loads, characterized by further comprising a current supply circuit that supplies a given current to the loads connected in series with the differential element when the differential element is off. It is thus possible to output the differential out put having a common-mode potential without a feed back structure and realize the source follower circuit serving as a buffer circuit suitable for driving the internal load inside the chip.

According to another aspect of the present invention, preferably, there is provided a receiving device having a differential circuit including a first differential amplifier circuit having a first differential element provided in a signal input circuit, a first constant current source connected to the first differential element, and a first and a second loads respectively connected to the first differential element; a second differential amplifier circuit having a second differential element provided in the signal input circuit, a second constant current source connected to the second differential element, and a third and a fourth loads respectively connected to the second differential element; a first source follower circuit that outputs a first differential voltage based on voltage drops developing across the first and second loads; and a second source follower circuit that outputs a second differential voltage based on the voltage drops developing across the third and fourth loads, characterized by further comprising a first current supply circuit that supplies a given current to the first and second loads when the first differential element is off; and a second current supply circuit that supplies the given current to the third and fourth loads when the second differential element is off. It is thus possible to output the differential out put having a common-mode potential without a feed back structure and realize the first and second source follower circuits serving as buffer circuits suitable for driving the internal load inside the chip.

BRIEF DESCRIPTION OF THE DRAWINGS

Preferred embodiments of the present invention will be described in detail with reference to the following drawings, wherein.

DESCRIPTION OF THE PREFERRED EMBODIMENTS (Principle)

A description will now be given of the principle of the present invention, before the description of preferred embodiments of the present invention.

The present invention relates to a differential circuit and a receiving device having the same. The differential circuit is capable of outputting a differential output having a constant common-mode potential without a feed back structure, and includes a buffer circuit suitable for driving the load inside the chip.

In order to achieve the above-mentioned object, in the differential circuit used for processing high-speed serial digital transmission signals, a topology having a combination of the source follower circuits in the structure of the output circuit is added to another topology in which the both limits of the common-mode operation range are compensated by connecting the differential amplifier circuit composed of the N-channel element in parallel with the differential amplifier circuit composed of the P-channel element. Thus configured circuit according to the above-mentioned topologies is capable of retaining a substantial rail-to-rail common-mode range and a high-speed buffering.

However, if the above-mentioned two topologies are simply combined in the circuit design, there arises a problem in that the common-mode potential of the differential output, which is available at the differential amplifier circuit, varies depending on the common-mode voltage in the input circuit. In order to solve the aforementioned problem, the differential circuit for operating the high-speed serial digital transmission signals in accordance with the present invention is configured so that a certain bias potential may be applied to the node of the source follower circuit of the output circuit. This is realized by, for example, providing a complementary bypass circuit between a current source and an input node of the complementary source follower circuit. The current source is connected to the respective common nodes of the differential amplifier circuits respectively composed of the N-channel element and the P-channel element. This bypass circuit serves as a current supply circuit that supplies a given amount of current to the load, when the differential amplifier circuit is not operating. It is thus possible to stabilize the operation point of the complimentary source follower circuit in the output circuit, regardless of the common-mode voltage in the input circuit. As a result, it is possible to compose a buffer circuit in which a differential output having a constant common-mode voltage is available.

Figure 2:
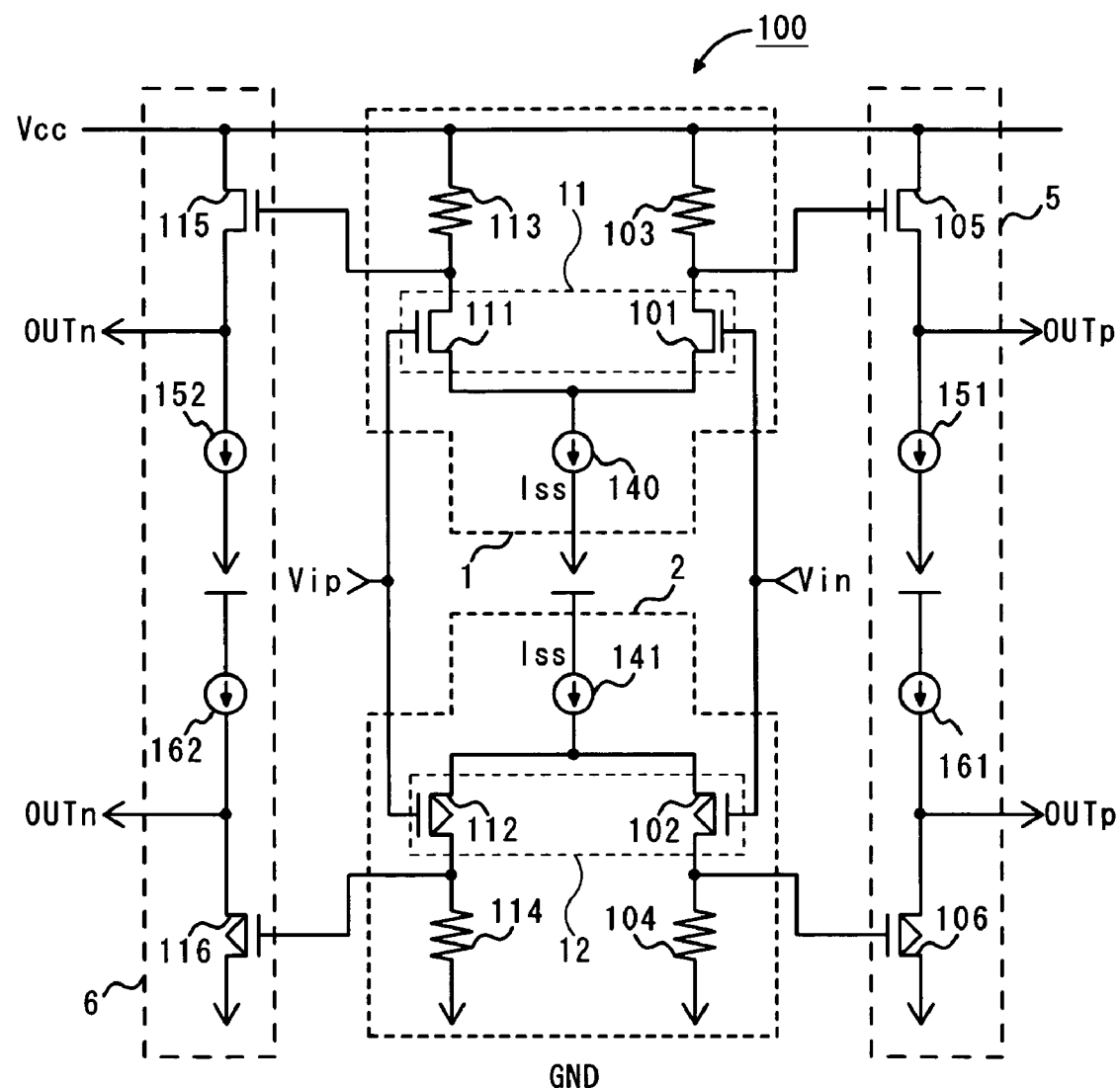
FIG. 2 is a circuit diagram showing the configuration of a differential circuit 100 used in the description of the present invention.

A description will be given in detail, with reference to the drawing. FIG. 2 is a circuit diagram of a differential circuit 100, in which the topology having a structure of a combination of the source follower circuits in the output circuit is added to another topology in which the both limits of the common-mode operation range are compensated by connecting the differential amplifier circuit composed of the N-channel element in parallel with the differential amplifier circuit composed of the P-channel element.

As shown in FIG. 2, the differential circuit 100 is configured to include an N-channel differential amplifier circuit 1 (the differential amplifier circuit composed of the N-channel element) and a P-channel differential amplifier circuit 2 (the differential amplifier circuit composed of the P-channel element), and two source follower circuits 5 and 6.

In this configuration, the N-channel differential amplifier circuit 1 includes an N-channel differential element 11, resistance loads 103 and 113, and a constant current source 140. The N-channel differential element 11 includes two N-channel MOS transistors (field-effect transistors are preferable. Hereinafter, simply referred to as transistors) 101 and 111. The resistance loads 103 and 113 are respectively connected to drain nodes of the N-channel MOS transistors 101 and 111. The constant power source 140 is commonly connected to source nodes of the two N-channel MOS transistors 101 and 111. In the same manner, the P-channel differential amplifier circuit 2 includes a P-channel differential element 12, resistance loads 104 and 114, and a constant current source 141. The P-channel differential element 12 includes two P-channel MOS transistors 102 and 112. The resistance loads 104 and 114 are respectively connected to drain nodes of the P-channel MOS transistors 102 and 112. The constant power source 141 is commonly connected to source nodes of the two P-channel MOS transistors 102 and 112.

The source follower circuit 5 serves as an output circuit that outputs a lower voltage of the differential signal, and includes an N-channel MOS transistor 105, a constant current source 151, a P-channel MOS transistor 106, and a constant current source 161. A gate node of the N-channel MOS transistor 105 is connected to the drain node of the N-channel MOS transistor 101. The constant current source 151 is a load of the N-channel MOS transistor 105. A gate node of the P-channel MOS transistor 106 is connected to the drain node of the P-channel MOS transistor 102. The constant current source 161 is a load of the P-channel MOS transistor 106. Thus, the N-channel MOS transistor 105 in the source follower circuit 5 outputs the differential voltage based on voltage drops developing across the resistance load 103 connected as a load of the N-channel MOS transistor 101. The P-channel MOS transistor 106 in the source follower circuit 5 outputs the differential voltage based on the voltage drops developing across the resistance load 104 connected as a load of the P-channel MOS transistor 102.

In the same manner, the source follower circuit 6 serves as an output circuit that outputs an upper voltage of the differential signal, and includes an N-channel MOS transistor 115, a constant current source 152, a P-channel MOS transistor 116, and a constant current source 162. A gate node of the N-channel MOS transistor 115 is connected to the drain node of the N-channel MOS transistor 111. The constant current source 152 is a load of the N-channel MOS transistor 115. A gate node of the P-channel MOS transistor 116 is connected to the drain node of the P-channel MOS transistor 112. The constant current source 162 is a load of the P-channel MOS transistor 116. Thus, the N-channel MOS transistor 115 in the source follower circuit 6 outputs the differential voltage based on the voltage drops developing across the resistance load 113 connected as a load of the N-channel MOS transistor 111. The P-channel MOS transistor 116 in the source follower circuit 6 outputs the differential voltage based on the voltage drops developing across the resistance load 114 connected as a load of the P-channel MOS transistor 112.

With respect to the above-mentioned configuration, a description will be given of the limits of the common-mode operation ranges of the N-channel differential amplifier circuit 1 and the P-channel differential amplifier circuit 2 in detail, with reference to FIG. 3.

Figure 3:
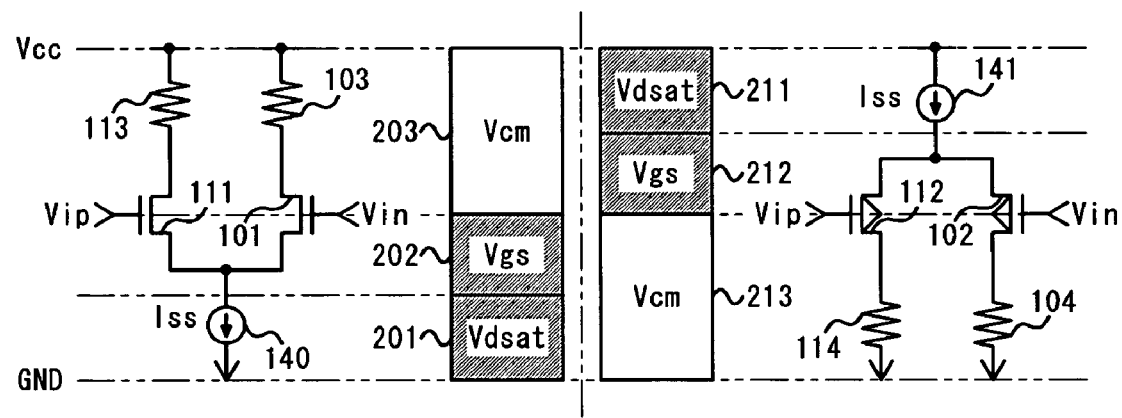
FIG. 3 is a view showing an operation of the differential circuit 100 shown in FIG. 2.

Referring to FIG. 3, a reference numeral 201 denotes a voltage (Vdsat) that determines a lower limit of the operation of the constant current source 140 for the N-channel differential amplifier circuit 1. A reference numeral 202 denotes a threshold voltage (Vgs) for operating the N-channel differential element 11 composed of the two N-channel MOS transistors 101 and 111. Therefore, the common-mode operation range of the N-channel differential amplifier circuit 1 is denoted by a resulting voltage Vcm (the reference numeral 203), which is the result where the voltage Vdsat (the reference numeral 201) and the threshold voltage Vgs (the reference numeral 202) are subtracted from the power supply voltage Vcc. In the same manner, a reference numeral 211 denotes a voltage (Vdsat) that determines a lower limit of the operation of the constant current source 141 for the P-channel differential amplifier circuit 2. A reference numeral 212 denotes a threshold voltage (Vgs) for operating the P-channel differential element 12 composed of the two P-channel MOS transistors 102 and 112. Therefore, the common-mode operation range of the P-channel differential amplifier circuit 2 is denoted by the resulting voltage Vcm (the reference numeral 213), which is the result where the voltage Vdsat (the reference numeral 211) and the threshold voltage Vgs (the reference numeral 212) are subtracted from the power supply voltage Vcc.

As is obvious from FIGS. 2 and 3, it is possible to retain the rail-to-rail common-mode range by connecting the respective differential amplifier circuits (1, 2) in parallel.

Next, as shown in FIG. 2, the topology having the differential amplifier circuit of the N-channel element connected in parallel with that of the P-channel element has been improved, and the output circuit in the differential circuit 200 is designed as the complimentary source follower circuit. A description will be given of the differential circuit 200 in detail, with reference to FIG. 4.

Figure 4:
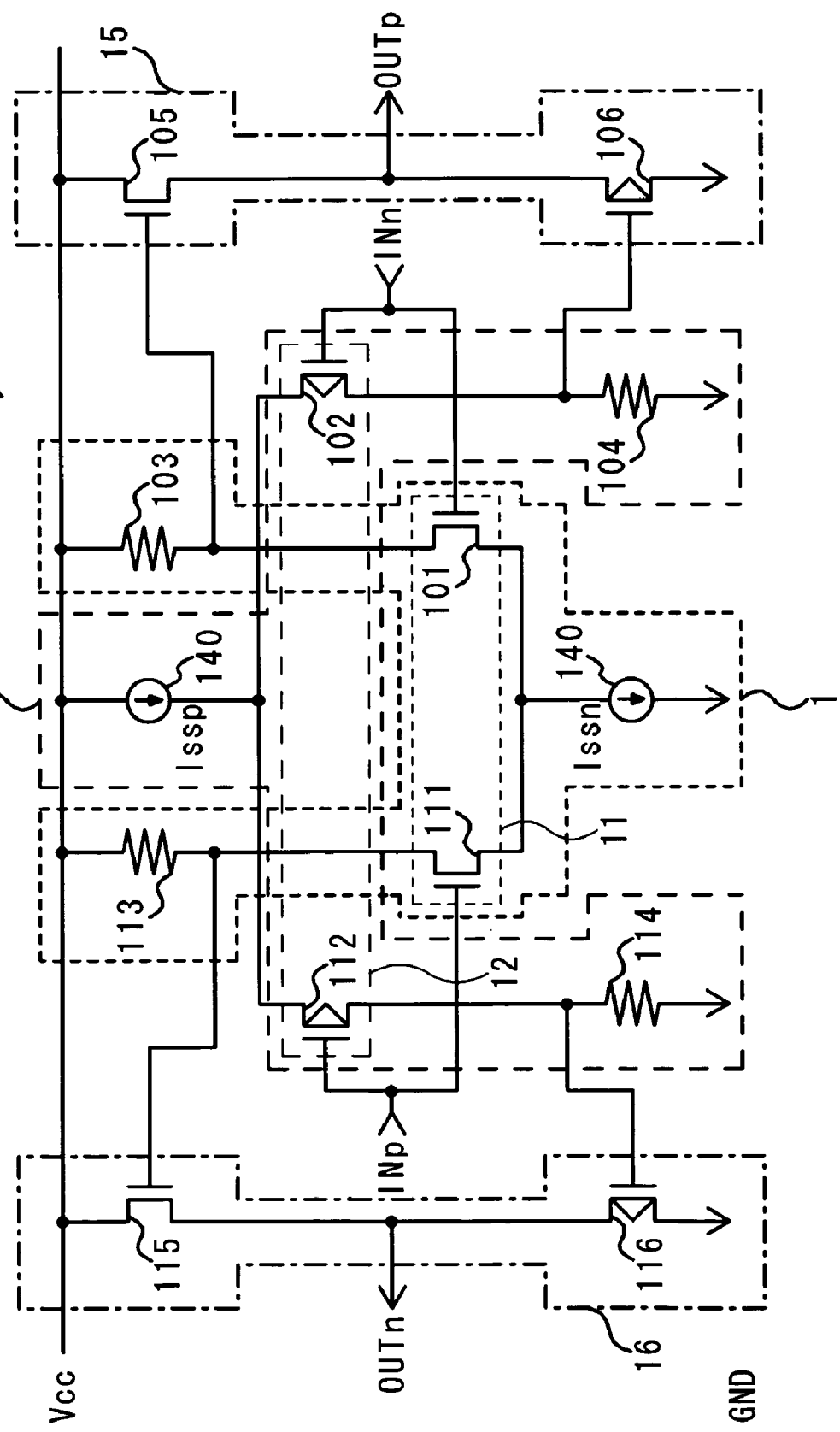
FIG. 4 is a circuit diagram showing the configuration of a differential circuit 200 used in the description of the present invention.

As shown in FIG. 4, the differential circuit 200 includes the N-channel differential amplifier circuit 1, the P-channel differential amplifier circuit 2, and the two complementary source follower circuits 15 and 16.

In this configuration, the N-channel differential amplifier circuit 1 and the P-channel differential amplifier circuit 2 have the same configurations as shown in FIG. 2.

The complimentary source follower circuit 15 serves as an output circuit that outputs a lower voltage of the differential signal, and includes the N-channel MOS transistor 105 and the P-channel MOS transistor 106. The gate node of the N-channel MOS transistor 105 is connected to the drain node of the N-channel MOS transistor 101. The gate node of the P-channel MOS transistor 106 is connected to the drain node of the P-channel MOS transistor 102. Thus, the N-channel MOS transistor 105 in the complimentary source follower circuit 15 outputs the differential voltage based on the voltage drops developing across the resistance load 103 connected as a load of the N-channel MOS transistor 101. The P-channel MOS transistor 106 in the source follower circuit 15 outputs the differential voltage based on the voltage drops developing across the resistance load 104 connected as a load of the P-channel MOS transistor 102.

In the same manner, the complimentary source follower circuit 16 serves as an output circuit that outputs an upper voltage of the differential signal, and includes the N-channel MOS transistor 115 and the P-channel MOS transistor 116. The gate node of the N-channel MOS transistor 115 is connected to the drain node of the N-channel MOS transistor 111. The gate node of the P-channel MOS transistor 116 is connected to the drain node of the P-channel MOS transistor 112. In the above-mentioned configuration, one of the MOS transistors in the complementary source follower circuits (15, 16) serves as a load of the other MOS transistor. Thus, the N-channel MOS transistor 115 in the source follower circuit 16 outputs the differential voltage based on the voltage drops developing across the resistance load 113 connected as a load of the N-channel MOS transistor 111. The P-channel MOS transistor 116 in the source follower circuit 6 outputs the differential voltage based on the voltage drops developing across the resistance load 114 connected as a load of the P-channel MOS transistor 112.

Figure 5:
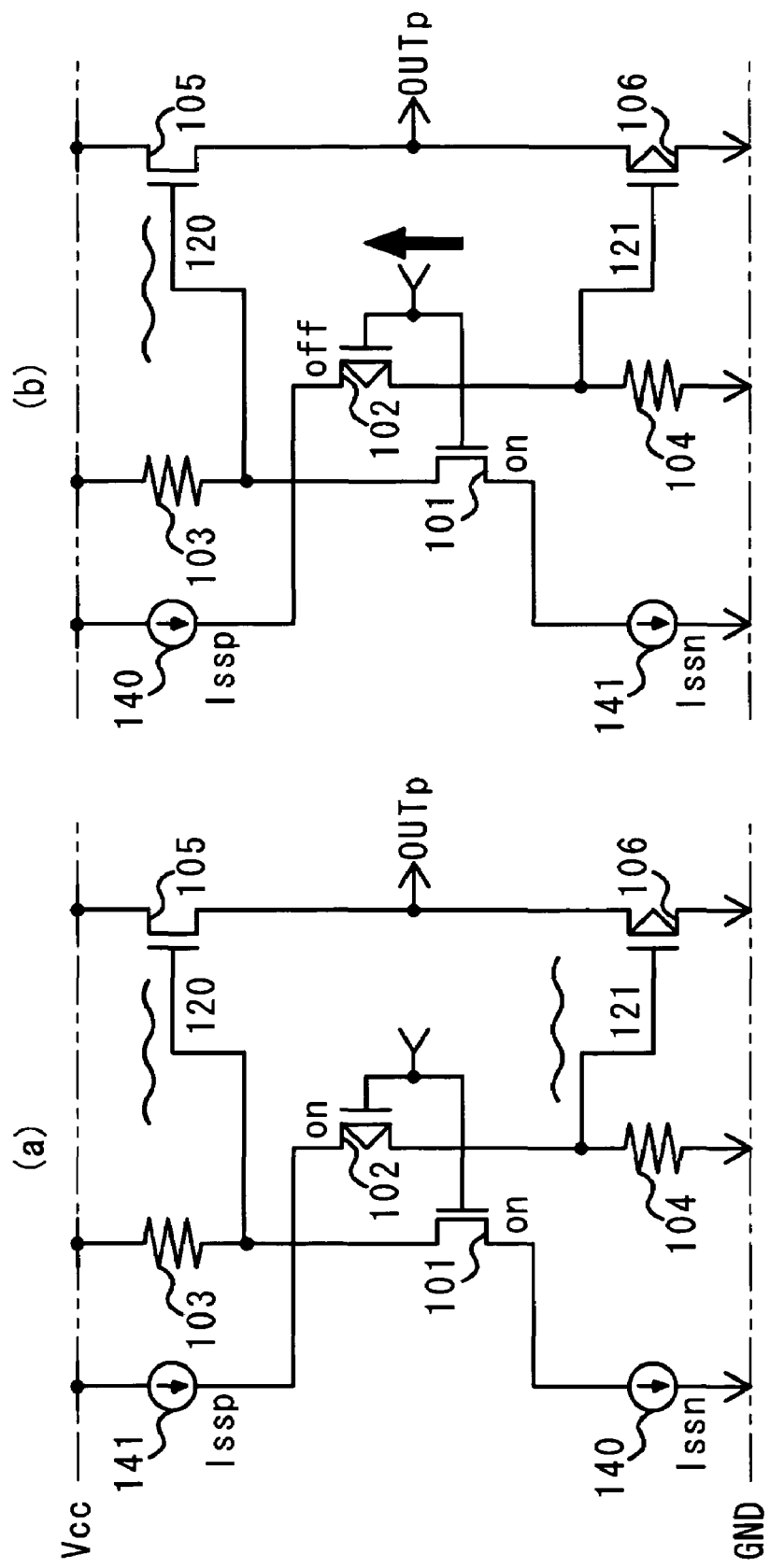
FIG. 5 is a view showing the operation of the differential circuit 200 shown in FIG. 4.

A description will be given of the operation of the differential circuit 200 having the above-mentioned configuration, with reference to FIG. 5. The N-channel MOS transistors 111 and 115, the P-channel MOS transistors 112 and 116, the load resistances 113 and 114, and interconnections that connect the transistors and the resistances in FIG. 4 are omitted. In other words, a component (the complementary source follower 16) that outputs the upper voltage in the differential signal is omitted.

FIG. 5A is a view describing an operating condition in which the both the differential amplifier of the N-channel element and that of the P-channel element are operating by the common-mode voltage in the input circuit. That is, in the diagram shown in FIG. 5A, the N-channel MOS transistor 101 in the N-channel differential element 11 and the P-channel MOS transistor 102 in the P-channel differential element 12 are electrically conducted (on). Therefore, as shown in FIG. 5A, the voltage output from the N-channel MOS transistor 101 and that output from the P-channel MOS transistor 102 are complimentarily modulated and are applied to nodes 120 and 121 respectively connected to the gate node of the N-channel MOS transistor 105 and the gate node of the P-channel MOS transistor 106 in the complimentary source follower circuit 15. Thus, a differential voltage OUTp, which is an output, can be kept constant.

On the other hand, referring to FIG. 5B, the common-mode voltage in the input circuit is increased, and the increased voltage exceeds the operation range of the differential amplifier circuit of the P-channel element, namely, the P-channel differential amplifier circuit 2. FIG. 5B is a view describing that only the N-channel differential amplifier circuit 1, which is the differential amplifier circuit of the N-channel element, is operating. That is, as shown in FIG. 5B, the N-channel MOS transistor 101 in the N-channel differential element 11 is electrically conductive (on), and the P-channel MOS transistor 102 of the P-channel differential element 12 is not electrically conductive (off). In this manner, the node 121 turns off the P-channel MOS transistor 102 completely, and a current does not flow through the resistance load 104 of the P-channel differential element 12, whereas the nodes 120 and 121 are respectively connected to the gate nodes of the N-channel MOS transistor 105 and the P-channel MOS transistor 106 shown in FIG. 5B, both of which are included in the complementary source follower circuit 15. This results in that the gate node of the P-channel MOS transistor 106 in the complementary source follower circuit 15 is constantly biased to ground potential. Thus, the P-channel MOS transistor 106 in FIG. 5B only operates as a load, and the differential circuit 200 operates like an equivalent circuit in which the P-channel MOS transistor 106 is connected as a load.

In the same manner, if the common-mode voltage in the input circuit drops, the dropped voltage gets out of the operation range of the differential amplifier circuit of the N-channel element, and only the differential amplifier circuit in the P-channel element operates. That is to say, in the diagrams shown in FIGS. 5A and 5B, the P-channel MOS transistor 102 in the P-channel differential element 12 is electrically conductive (on), and the N-channel MOS transistor 101 in the N-channel differential element 11 is not electrically conducted (off). The node 120 turns off the N-channel MOS transistor 101 completely, and a current does not flow through the resistance load 103 in the N-channel differential element 11, whereas the nodes 120 and 121 are respectively connected to the gate nodes of the N-channel MOS transistor 105 and the P-channel MOS transistor 106, both of which are included in the complementary source follower circuit 15. This results in that the gate node of the N-channel MOS transistor 105 in the complementary source follower circuit 15 is constantly biased to ground potential. Thus, the N-channel MOS transistor 105 only operates as a load, and the P-channel MOS transistor 106 operates as just a source follower circuit other than the complementary source follower circuit to which a load of the N-channel MOS transistor 105 is connected.

Figure 6:
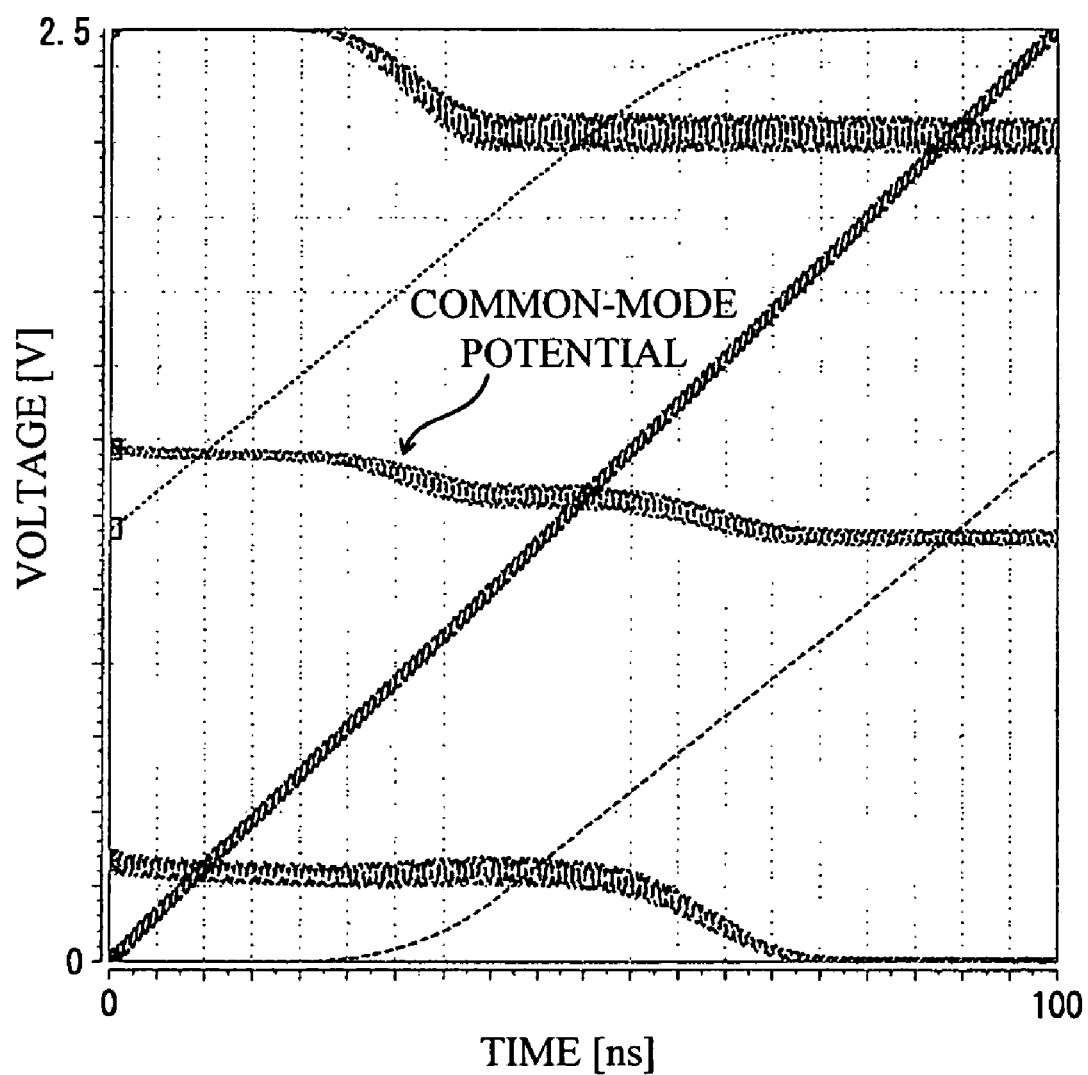
FIG. 6 is a graph showing simulation results of the differential circuit 200 shown in FIG. 4.

FIG. 6 is a graph showing simulation results of the differential circuit 200. In this simulation, the common-mode level has been swept from 0 to 2.5 V. As is obvious from the graph in FIG. 6, it is found that the differential circuit 300 has fluctuating (changing) common-mode potentials of the output voltage in the complementary source follower circuit serving as the output circuit. This is because one of the two MOS transistors is biased to ground, the two MOS transistors being respectively included in the complementary source follower circuits 15 and 16 provided as the output circuits, and the two MOS transistors operate in different operating modes, as described above. In addition, FIG. 6 shows that the amplitude (hereinafter referred to as gain) of the differential output is smaller, when the common-mode level voltage is close to 0 or 2.5 V.

In this manner, the complementary source follower circuits in the output circuit have different operating modes depending on the common modes in the input circuit. Therefore, it is difficult to stabilize the common-mode potential of the output voltage in the complementary source follower circuit serving as the output circuit. Further, there is a problem in that the gain becomes smaller when the common-mode level is closer to 0 V or 2.5 V.

Figure 7:
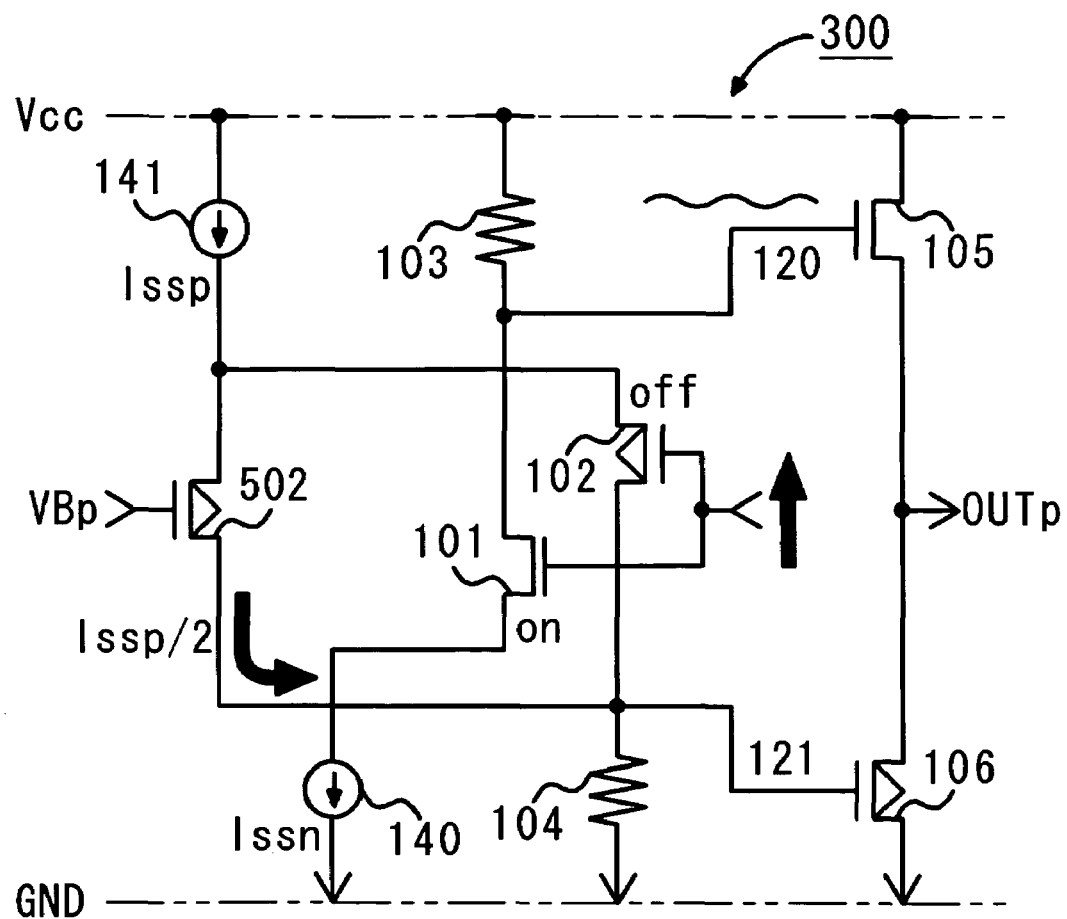
FIG. 7 is a circuit diagram showing the configuration of a differential circuit 300.

Then, the inventors have devised an equivalent circuit that is configured to prevent the complementary source follower circuits 15 and 16 of the output circuits from operating in common-modes different from that of the input circuit. FIG. 7 is a circuit diagram of the differential circuit 300 that is designed according to the aforementioned topology. The component (the complementary source follower circuit 16) for outputting the upper voltage in the differential signal will be omitted in a description with the use of FIG. 7 for simplification, and a description will be given of only a case where the common-mode voltage in the input circuit rises.

The above-mentioned fluctuations in the common-mode potentials in the output voltage are generated when the common-mode voltage in the input circuit rises. This is because a current does not flow through the resistance load 104, when the P-channel MOS transistor 102 completely turns off. Accordingly, the P-channel MOS transistor 106 included in the complementary source follower circuit 15 is biased to ground.

In accordance with the present invention, a bypass circuit is added in order to introduce a constant current to the load resistance 104 in the differential circuit of the P-channel element, if the common-mode voltage in the input circuit exceeds the operation range of the differential amplifier circuit of the P-channel element. This bypass circuit operates as a current supply circuit, and in particularly, operates as a bias input circuit so as to input a given bias potential to the nodes of the complementary source follower circuits 15 and 16. It is thus possible to realize the equivalent circuit having the same configuration as the circuit in which the constant-current biased P-channel MOS transistor is connected to the N-channel MOS transistor 105 in the complementary source follower circuit 15 of the output circuit as a load element. In the same manner, if the common-mode voltage in the input circuit exceeds the operation range of the differential amplifier circuit in the N-channel element, there is provided a circuit in which the bypass circuit serves as a load in order to introduce the constant current to the load resistance 103 of the differential amplifier circuit in the N-channel element. This bypass circuit serves as the current supply circuit. Even in the aforementioned case, it is thus possible to realize the equivalent circuit having the same configuration as the circuit in which the constant-current biased N-channel MOS transistor 105 is connected to the P-channel MOS transistor 106 in the complementary source follower circuit 15 of the output circuit as a load element.

The above-mentioned current supply circuit pass the current through the node connected to the load of the differential amplifier circuit (the load resistance 104 and the P-channel MOS transistor 106) from the constant current source 141 connected to the common node of the differential amplifier circuit composed of the P-channel element. This can make it possible to compose the bypass circuit (the current supply circuit) by connecting the P-channel MOS transistor 502, which is biased by a bias potential VBp as shown in FIG. 7, to between the respective nodes.

An Embodiment

Next, a description will be given in detail of an illustrative embodiment of a differential circuit 400 that is designed according to the equivalent circuit as shown in FIG. 7. More specifically, the differential circuit 400 is designed by adding a topology having a combination of the complementary source follower circuits as the output circuits and further adding another topology having the bypass circuits arranged between the common-modes of the differential amplifier circuits and the gate node inputs of the complementary source follower circuits, to yet another topology of compensating for the limits of the common-mode operation ranges by connecting the differential amplifier circuit of the N-channel element in parallel with the differential amplifier circuit of the P-channel element. This bypass circuit operates as the current supply circuits that supply a given current to the load, when the differential amplifier circuit is not operating.

Figure 8:
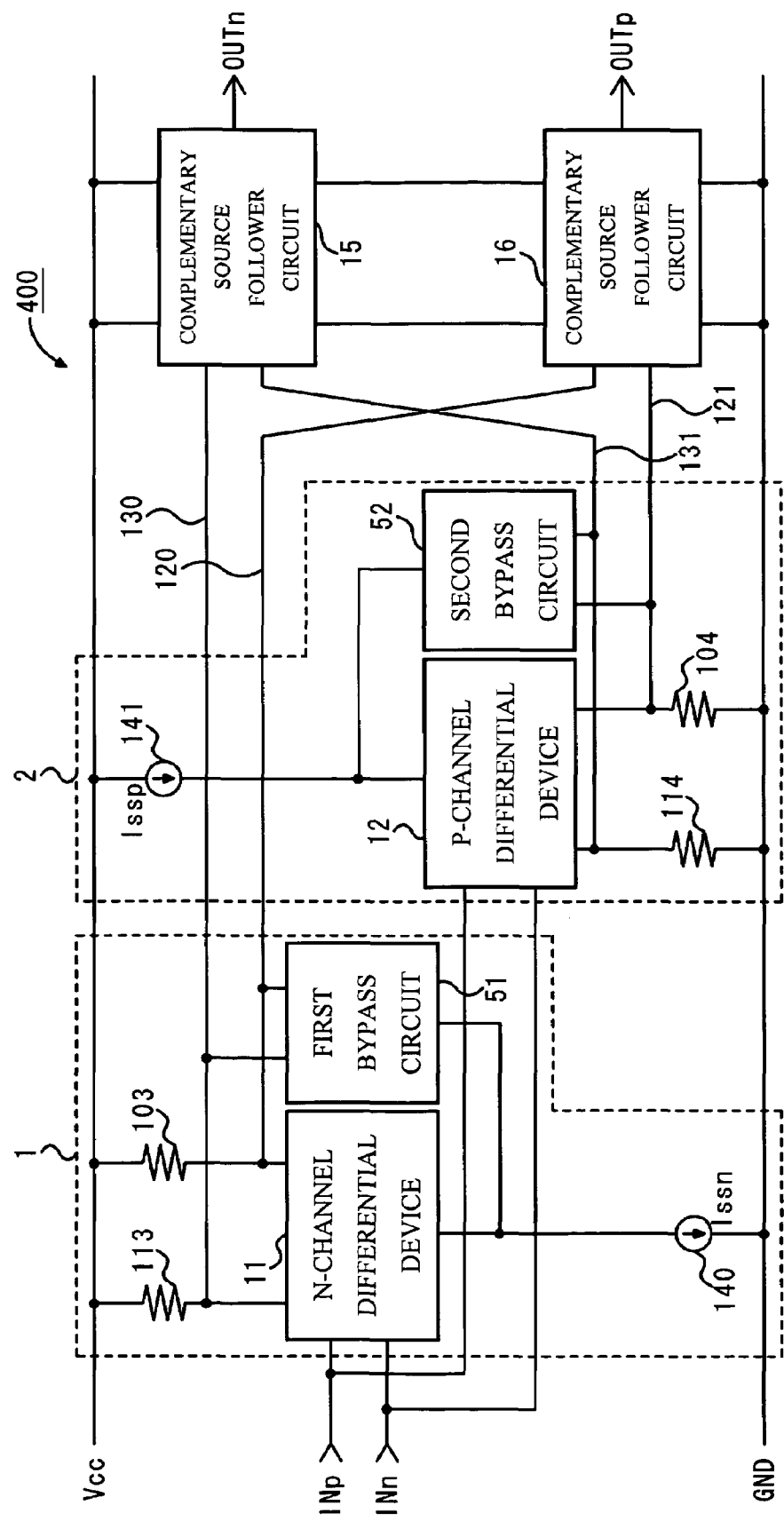
FIG. 8 is a block diagram showing the configuration of a differential circuit 400 to be designed with a topology of the differential circuit 300 shown in FIG. 7.

FIG. 8 is a block diagram of the differential circuit 400. As shown in FIG. 8, the differential circuit 400 includes the N-channel differential amplifier circuit 1, the P-channel differential amplifier circuit 2, the two complementary source follower circuits 15 and 16, a first bypass circuit 51, and a second bypass circuit 52. The first bypass circuit 51 bypasses the N-channel differential element 11. The second bypass circuit 52 bypasses the P-channel differential element 12. The first bypass circuit 51 and the second bypass circuit 52 respectively operate as the current supply circuits that supply given currents to the corresponding loads, when the corresponding differential amplifier circuits are off.

Figure 9:
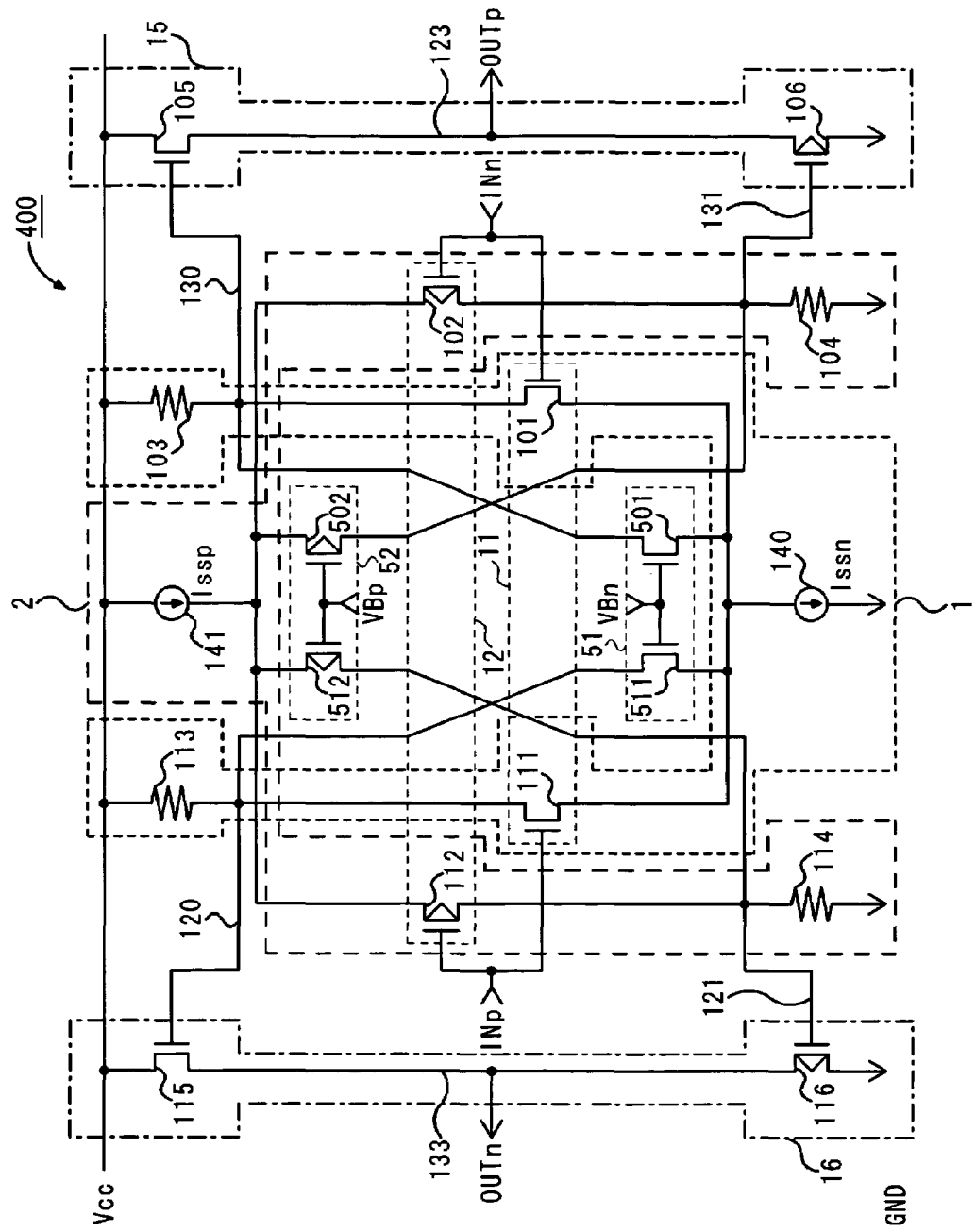
FIG. 9 is a view showing a circuit structure of the differential circuit 400 shown in FIG. 8.

FIG. 9 shows a circuit diagram of the differential circuit 400 in detail. As is obvious from FIG. 9, the N-channel differential amplifier circuit 1 includes the N-channel differential element 11, the resistance loads 103 and 113, and the constant current source 140. The N-channel differential element 11 is comprised of a pair of N-channel elements. The P-channel differential amplifier circuit 2 includes the P-channel differential element 12, the resistance loads 104 and 114, and the constant current source 141. The P-channel differential element 12 is comprised of a pair of P-channel elements. Nodes 130 and 131, among the output nodes of the two differential amplifier circuits, are connected the complementary source follower circuit 15 composed of the N-channel MOS transistor 105 and the P-channel MOS transistor 106. Nodes 120 and 121, among the output nodes of the two differential amplifier circuits, are connected the complementary source follower circuit 16 composed of the N-channel MOS transistor 115 and the P-channel MOS transistor 116.

The first bypass circuit 51 includes two N-channel MOS transistors 501 and 511 having gate nodes to which a bias potential VBn is applied. The first bypass circuit 51 bypasses the N-channel MOS transistors 101 and 111 respectively, and connects the constant current source 140 to the nodes 130 and 120. In the same manner, the second bypass circuit 52 includes two P-channel MOS transistors 502 and 512 having gate nodes to which a bias potential VBp is applied. The second bypass circuit 52 bypasses the P-channel MOS transistors 102 and 112 respectively, and connects the constant current source 141 to the nodes 131 and 121. In this manner, it is possible to prevent the N-channel and P-channel MOS transistors 105, 115, 106, and 116 from being biased to ground by respectively biasing the N-channel and P-channel MOS transistors 501, 511, 502, and 512 with constant voltages. As described above, the N-channel and the P-channel MOS transistors 105, 115, 106, and 116 compose the complementary source follower circuits 15 and 16 respectively, and the N-channel and the P-channel MOS transistors 501, 511, 502, and 512 compose the first and second bypass circuits 51 and 52 respectively. Other configurations are same as those in FIG. 4, and a description thereof is omitted here.

Figure 10:
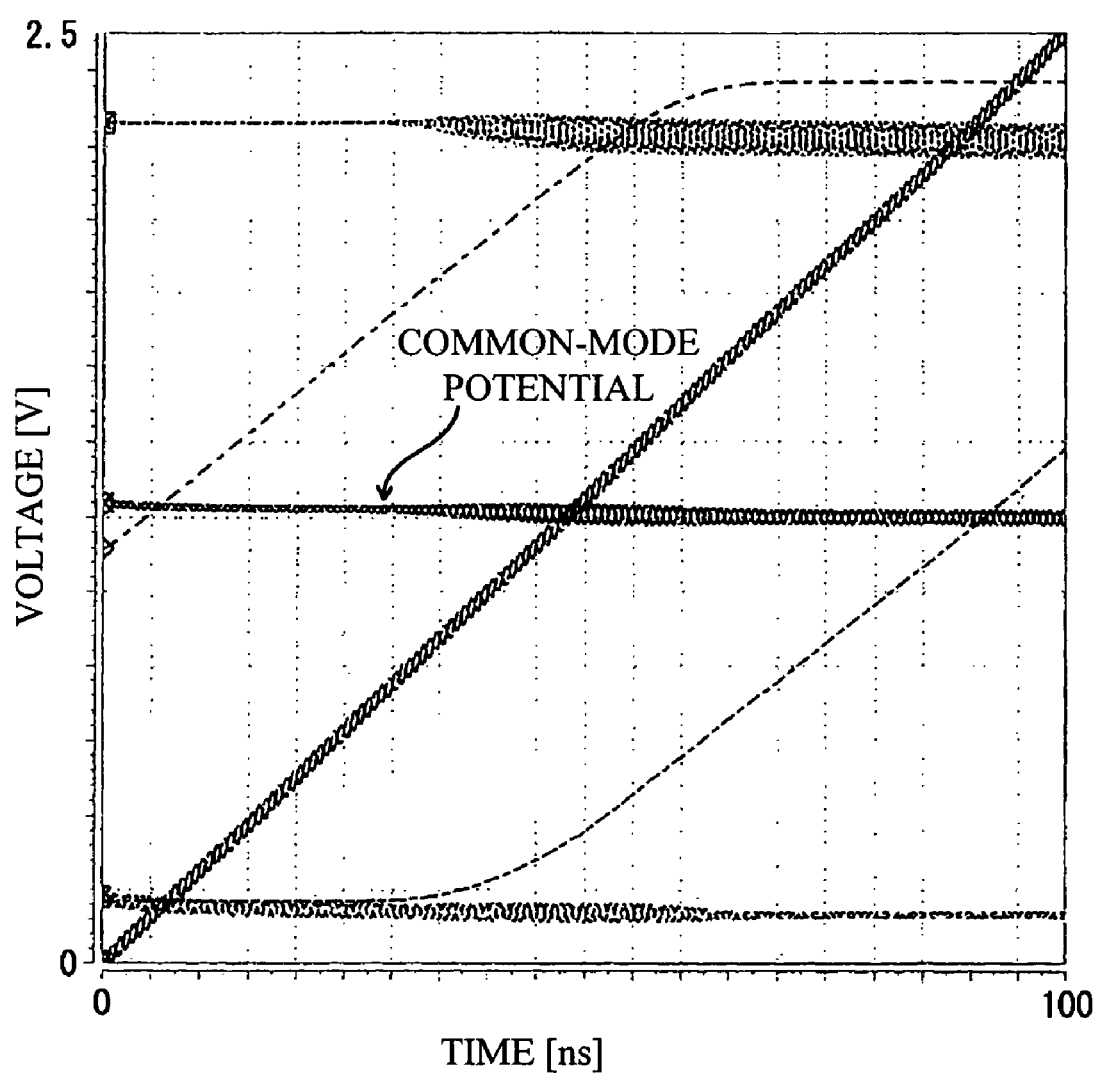
FIG. 10 is a graph showing simulation results of the differential circuit 400 shown in FIG. 8.

FIG. 10 shows simulation results of thus configured differential circuit 400. Also in this simulation, the common-mode level has been swept from 0 to 2.5 V in order to compare the simulation results shown in FIG. 6, and VBp is set at 1.5 V and VBn is set at 1.0 V. FIG. 10 exhibits that the changes (fluctuations) in the common-mode potential have been eliminated, and the differential circuit 400 has a constant output voltage in the complementary source follower circuit serving as the output circuit.

The problem of the common-mode potential in the output is solved by designing with the above-mentioned topologies. However, another problem of fluctuating gain has not been solved yet. This is exhibited from the simulation results shown in FIG. 10. Then, the inventors of the present invention have founded that a tail current is bypassed by adjusting the bias potentials applied to the gate nodes of the first and second bypass circuits 51 and 52 so as to solve the problem of the gain.

That is, the problem of the gain can be solved by determining the values of the bias potentials VBp and VBn so as to bypass the tail current, while both of the N-channel differential amplifier circuit 1 and the P-channel differential amplifier circuit 2 are operating.

The values of the bias potentials VBp and VBn are independent of an input signal INp of the N-channel differential amplifier circuit 1 and an input signal INn of the P-channel differential amplifier circuit 2, and are arbitrary constant voltages.

Figure 11:
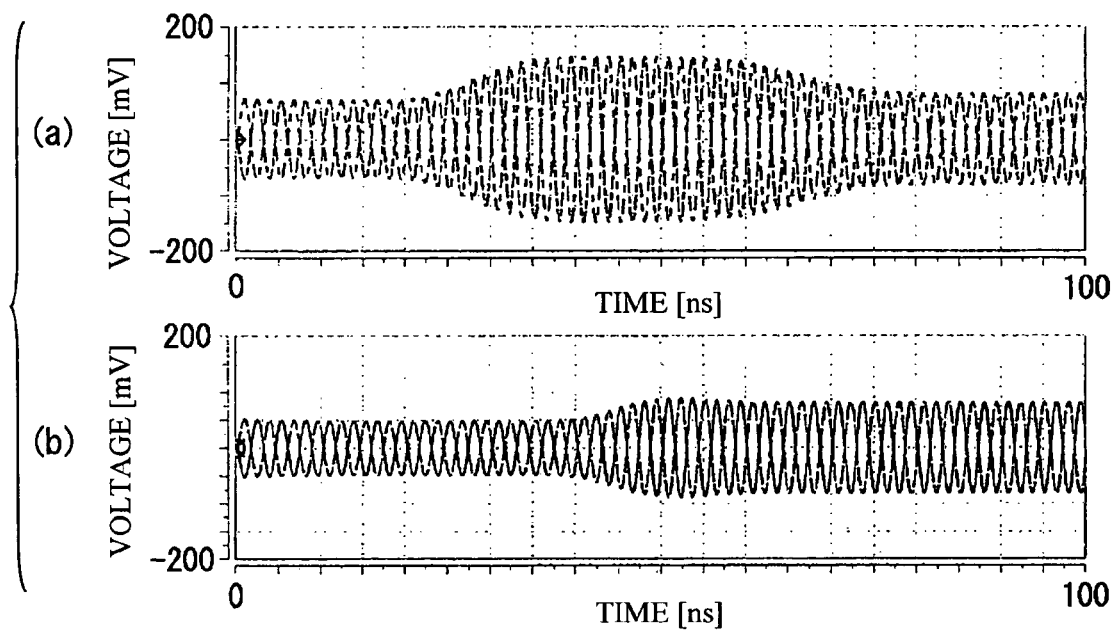
FIG. 11 is a graph showing simulation results of a case where the bias potentials VBp and VBn are set to ½ of Vcc.
Figure 12:
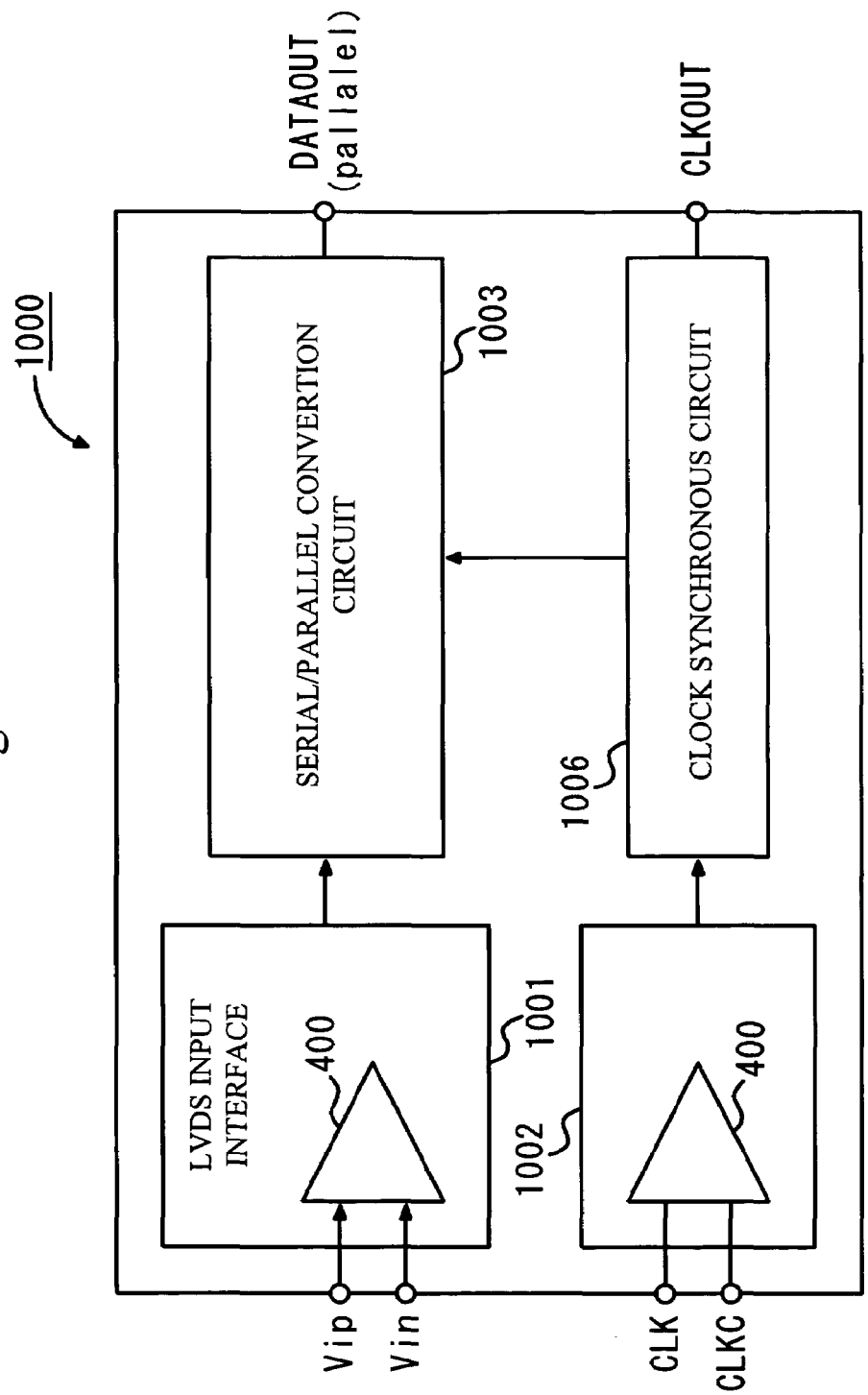
FIG. 12 is a block diagram showing a receiving device 1000 having the differential circuit 400 of the present invention.

For a simple validation, FIG. 11A shows simulation results of a case where the biases are respectively deeper by 0.5 V, by setting VBp and VBn to Vcc/2. FIG. 11B is an enlarged view of the simulation results shown in FIG. 10 for comparison. Referring to FIGS. 10A and 10B, the gain has been stabilized by adjusting the bias potentials VBp and VBn, as described.

Figure 1:
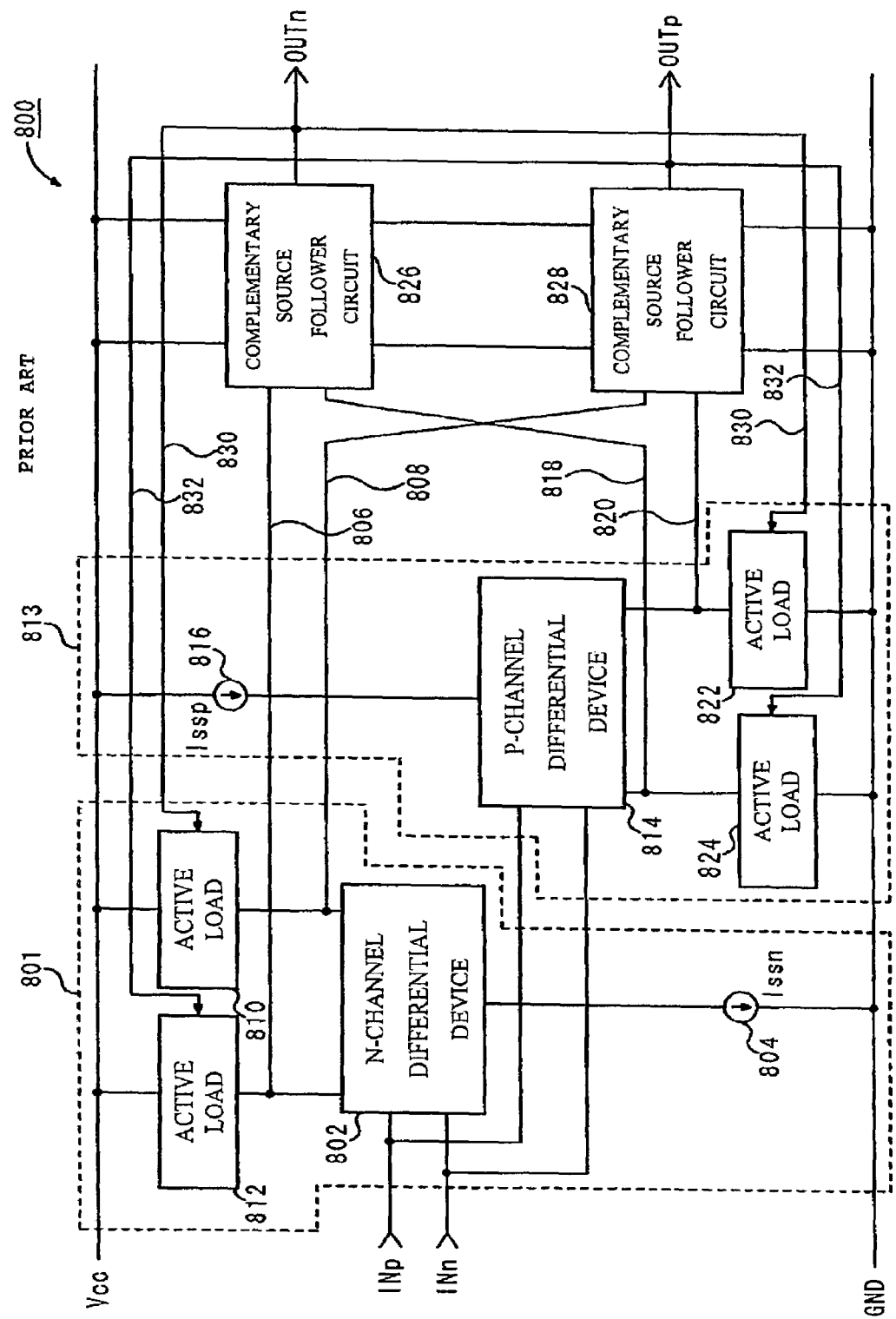
FIG. 1 is a block diagram showing a configuration of a differential circuit 800 of a conventional technique 1.

The differential circuit of the conventional technique 1 shown in FIG. 1 has an object of preventing the non-linear operation of the differential output and realizing the stabilization of the circuit. This object is achieved by preventing the operation points of the active loads 810, 812, 822, and 824 composed of the P-channel/N-channel MOS transistors from shifting from the linear region into the saturate region, so as to operate in the linear region at any time. Therefore, the object of the present invention cannot be solved by the conventional technique 1. The differential circuit of the conventional technique 1 has the object of preventing the non-linear operation in the differential output for stabilization. However, the object of the present invention is to stabilize the common-mode potentials of the output voltages from the complementary source follower circuits of the output circuits, because the common-mode potentials of the output voltages in the output circuits vary depending on the different operation mode of the complementary source follower circuits of the output circuits, which is dependent on the common-modes of the input circuits. In addition, the feature of the present invention is to arrange the first and the second bypass circuits (the current supply circuits) respectively arranged between a constant current source for the N-channel differential element and the output node of the differential amplifier circuit and between another constant current source for the P-channel differential element and the output node of the differential amplifier circuit. This feature is not disclosed in the conventional technique 1. Thus, those skilled in the art cannot easily achieve the object of the present invention by applying the conventional technique 1.

The differential circuit 400 to be designed according to thus configured equivalent circuit is incorporated into a receiving device 1000, in particular, a LVDS (Low Voltage Differential Signaling) receiver 1000 as the differential circuit. In this configuration, the differential circuit 400 is provided in the input circuits for the LVDS signals in LVSD input interfaces 1001 and 1002. Here, in this case, a terminating resistance of the LVDS signal is set at 100 Ω. Also, in the above-mentioned configuration, the differential circuit 400 is formed on a highly integrated single chip. The receiving device is thus realized by including the differential circuit having the buffer circuit, which outputs the differential output having a constant common-mode potential without a feed back structure and is suitable for driving the load inside the chip.

Another Embodiment

Although a few preferred embodiments of the present invention have been shown and described, it would be appreciated by those skilled in the art that changes may be made in these embodiments without departing from the principles and spirit of the invention, the scope of which is defined in the claims and their equivalents.

As described, the differential circuit and the receiving device having the same are thus realized by including the buffer circuit that outputs the differential output having a constant common-mode potential without a structure of feed back and is suitable for driving the load inside the chip.

In other words, it is thus possible to eliminate the modulation of the output common-mode potential generated by the input common-mode voltage, which is a problem when the rail-to-rail differential amplifier circuit is used for receiving the serial digital transmission signal particularly in the differential circuit of the serial digital transmission signal. It is possible to realize the rail-to-rail differential circuit including a combination of the buffer circuits, each of which outputs the differential output having a constant common-mode potential, and is suitable for driving the load inside the chip.

What is claimed is:

1. A differential circuit including a differential amplifier circuit having a differential element provided in a signal input circuit, a constant current source connected to the differential element, and loads respectively connected to the differential element; and a source follower circuit that outputs a differential voltage based on voltage drops developing across the loads, comprising a current supply circuit that supplies a given current to the loads connected in series with the differential element when the differential element is off and that has an end connected to a connection node between said loads and said differential element and that has another end connected to a connection node between said differential element and said constant current source.

2. A differential circuit including a first differential amplifier circuit having a first differential element provided in a signal input circuit, a first constant current source connected to the first differential element, and a first and a second loads respectively connected to the first differential element; a second differential amplifier circuit having a second differential element provided in the signal input circuit, a second constant current source connected to the second differential element, and a third and a fourth loads respectively connected to the second differential element; a first source follower circuit that outputs a first differential voltage based on voltage drops developing across the first and second loads; and a second source follower circuit that outputs a second differential voltage based on the voltage drops developing across the third and fourth loads, comprising a first current supply circuit that supplies a given current to the first and second loads when the first differential element is off, said first current supply circuit having a first current supply circuit end and another first current supply circuit end, said first current supply circuit end being connected to a first connection node between said first loads and said second loads and said first differential element, said other first current supply, circuit end being connected to a second connection node between said first differential element and said first constant current source; and a second current supply circuit that supplies the given current to the third and fourth loads when the second differential element is off, said second current supply circuit having a second current supply circuit end and another second current supply circuit end, said second current supply circuit end being connected to a third connection node between said third loads and said fourth loads and said second differential element, said other second current supply circuit end being connected to a fourth connection node between said second differential element and said second constant current source.

3. The differential circuit as claimed in claim 2 wherein said first source follower circuit includes a first source follower circuit N-channel MOS transistor having a first source follower circuit N-channel MOS transistor end connected to a first power supply (Vcc), another first source follower circuit N-channel MOS transistor end connected to a first output terminal, and a first source follower circuit N-channel MOS transistor gate connected to the first load, and a first source follower circuit P-channel MOS transistor having a first source follower circuit P-channel MOS transistor end connected to a second power supply (GND), another first source follower circuit P-channel MOS transistor end connected to the first output terminal, and a first source follower circuit P-channel MOS transistor gate connected to the second load; and said second source follower circuit includes a second source follower circuit N-channel MOS transistor having a second source follower circuit N-channel MOS transistor end connected to the first power supply (Vcc), another second source follower circuit N-channel MOS transistor end connected to a second output terminal, and a second source follower circuit N-channel MOS transistor gate connected to the third load, and a second source follower circuit P-channel MOS transistor having a second source follower circuit P-channel MOS transistor end connected to the second power supply (GND), another second source follower circuit P-channel MOS transistor end connected to the second output terminal, and a second source follower circuit P-channel MOS transistor gate connected to the fourth load.

4. The differential circuit as claimed in claim 2, wherein:
the first differential element includes two N-channel MOS transistors having a first differential, element N-channel MOS transistor ends connected to the first connection node, another first differential element N-channel MOS transistor end connected to the second connection node and said first differential element having first differential element N-channel MOS transistor gates, said first differential element N-channel MOS transistor gates being connected to each other;
the second differential element includes two P-channel MOS transistors having a second differential element P-channel MOS transistor ends connected to the third connection node, another second differential element P-channel MOS transistor end connected to the fourth connection node and said second differential element having second differential element P-channel MOS transistor gates, said second differential element P-channel MOS transistor gates being connected to each other; and
bias voltages are respectively applied to said first differential element N-channel MOS transistor gates and said second differential element P-channel MOS transistor gates so that tail currents flow between said first differential element N-channel MOS transistor ends and second differential element P-channel MOS transistor ends to said other first differential element N-channel MOS transistor end and said other second differential element P-channel MOS transistor end in a state which both the first and second differential circuits operate.

* * * * *